(12) United States Patent
Abel

(10) Patent No.: US 6,937,678 B2
(45) Date of Patent: Aug. 30, 2005

(54) RATE AND ACCELERATION LIMITING FILTER AND METHOD FOR PROCESSING DIGITAL SIGNALS

(75) Inventor: Stephen G. Abel, Chandler, AZ (US)

(73) Assignee: Honeywell International, Inc., Morristown, NJ (US)

( * ) Notice: Subject to any disclaimer, the term of this patent is extended or adjusted under 35 U.S.C. 154(b) by 804 days.

(21) Appl. No.: 09/975,865

(22) Filed: Oct. 12, 2001

(65) Prior Publication Data

US 2003/0072398 A1 Apr. 17, 2003

(51) Int. Cl.[7] .................................................. H04B 1/10
(52) U.S. Cl. ........................ 375/350; 375/285; 327/551
(58) Field of Search ................................ 375/229, 284, 375/285, 350; 327/551, 552; 702/191, 193; 708/300

(56) References Cited

U.S. PATENT DOCUMENTS

| | | | |
|---|---|---|---|
| 4,876,655 A | 10/1989 | Carlton et al. | |
| 5,119,003 A | * 6/1992 | Lin et al. | 318/561 |
| 5,136,529 A | 8/1992 | Makie et al. | |
| 5,339,335 A | 8/1994 | Molnar | |
| 5,422,827 A | 6/1995 | Niehaus | |
| 5,687,735 A | 11/1997 | Forbes et al. | |
| 5,712,874 A | * 1/1998 | Okamoto | 375/243 |
| 5,862,516 A | 1/1999 | Hirata | |
| 5,966,684 A | 10/1999 | Richardson et al. | |
| 6,081,820 A | 6/2000 | Holowko | |
| 6,195,596 B1 | * 2/2001 | Kim | 700/245 |

FOREIGN PATENT DOCUMENTS

| | | |
|---|---|---|
| EP | 0 465 334 | 1/1992 |
| GB | 1 266 038 | 3/1972 |
| WO | PCT/US02/32750 | 2/2003 |

* cited by examiner

*Primary Examiner*—Chieh M. Fan
(74) *Attorney, Agent, or Firm*—Ingrassia Fisher & Lorenz

(57) ABSTRACT

A digital filter and filtering method uses a rate of change limit and an acceleration limit to significantly attenuate high bandwidth noise signals with minimal phase lag, while simultaneously passing low bandwidth signals substantially uncorrupted. The filter uses two memory states making it computationally efficient.

28 Claims, 8 Drawing Sheets

RATE AND ACCELERATION LIMITING FILTER AND METHOD FOR PROCESSING DIGITAL SIGNALS

BACKGROUND OF THE INVENTION

The present invention relates to digital signal processing and filtering and, more particularly, to a digital filter and filtering method that attenuates the noise content of sampled analog signals.

Control systems are designed to regulate the performance of a device or physical parameter to a particular configuration or value. A control system may include an input to receive a command signal representative of a desired configuration or value, and an output that supplies a process control signal that is used to regulate the device or parameter to achieve that desired configuration or value. In a close-loop control system, a sensor may be used to sense the device configuration or parameter value, and supply a feedback signal to the control system input. The command signal and the feedback signal may then be compared, and the process control signal appropriately adjusted until the input signal and feedback signal comparison indicate that the device or parameter has achieved the desired configuration or value.

The control systems generally described above may be implemented using either an analog based design, a digital signal processor (DSP) based design, or a combination of both. The performance of a control system, no matter how it is implemented, may be adversely affected by noise. Noise may be injected into the control system from various sources, including electromagnetic interference (EMI), poor system grounds, ground loops, and the sensors used to provide the feedback control signals. The magnitude of the noise injected into a control system from these various sources can be controlled to a certain extent. However, injected noise can never be fully eliminated. Thus, the remaining noise that is injected may either be filtered out or tolerated in the system design.

In analog systems, noise filtration may be provided by incorporating one or more filter circuits, which generally consist of discrete components. In DSP based systems, digital filters are incorporated to attenuate injected noise. Digital filters are processors programmed to implement an algorithm that performs predetermined numerical calculations on sampled values of a signal.

No matter which type of filtration is used, analog or digital, the filter's effectiveness against noise may present a trade off with control system performance. In other words, as a filter's effectiveness against noise increases, the control system's performance may decrease. This is because increasing a filter's noise attenuating effectiveness may add phase lag to the filtered control signals, which in turn may reduce control system stability. To accommodate reduced control system stability, the bandwidth of the system may be reduced, which in turn may decrease control system performance. Moreover, in digital based control systems, using digital filters to attenuate noise may increase computation time of the processor(s). Although digital filters have been designed that minimally impact control system performance, these filters are generally high order filters with potentially significant computation time demands.

Hence, there is a need for a digital filter that can effectively attenuate noise in a control system while having minimal impact on system performance and that does not require significant computation time. The present invention addresses this need.

SUMMARY OF THE INVENTION

The present invention provides a digital filter for attenuating noise in a system that incurs minimal processing time, and/or causes minimal attenuation or phase lag of the filtered signal, and/or does not significantly impact system performance.

In one aspect of the invention, and by way of example only, a method of filtering digital input signals having digital values associated therewith includes determining a first rate of change of the digital input signal values, supplying rate adjusted digital ouput signals values, determining a second rate of change of the rate adjusted digital output signal values, and supplying acceleration adjusted digital output signal values. The rate adjusted digital output signal values are (i) equivalent to the digital input signal values when the first rate of change is less than a predetermined rate magnitude and (ii) equivalent to a predetermined rate limit value when the first rate of change equals or exceeds the predetermined rate magnitude. The acceleration adjusted digital output signal values are (i) equivalent to the rate adjusted digital output signal values when the second rate of change is less than a predetermined acceleration magnitude and (ii) equivalent to the rate adjusted digital output signal values with a predetermined acceleration value subtracted therefrom when the second rate of change equals or exceeds the predetermined acceleration magnitude.

In another exemplary aspect of the present invention, a digital filter for filtering digital input signals having digital values associated therewith includes rate of change determining means and acceleration determining means. The rate of change determining means is for determining a first rate of change of the digital input signal values and supplying rate adjusted digital output signal values. The acceleration determining means is for determining a second rate of change of the rate adjusted digital output signal values and supplying acceleration adjusted digital output signal values. The rate adjusted digital output signals supplied by the rate of change determining means are equivalent to the digital input signal values when the first rate of change is less than a predetermined rate magnitude and equivalent to a predetermined rate limit value when the second rate of change equals or exceeds the predetermined rate magnitude. The accleration adjusted digital ouput signal values are equivalent to the rate adjusted digital output signal values when the second rate of change is less than a predetermined acceleration magnitude and equivalent to the rate adjusted digital output signal values with a predetermined acceleration value subtracted therefrom when the second rate of change equals or exceeds the predetermined acceleration magnitude.

Other independent features and advantages of the preferred filter will become apparent from the following detailed description, taken in conjunction with the accompanying drawings which illustrate, by way of example, the principles of the invention.

DETAILED DESCRIPTION OF VARIOUS EMBODIMENTS

Figure 1:
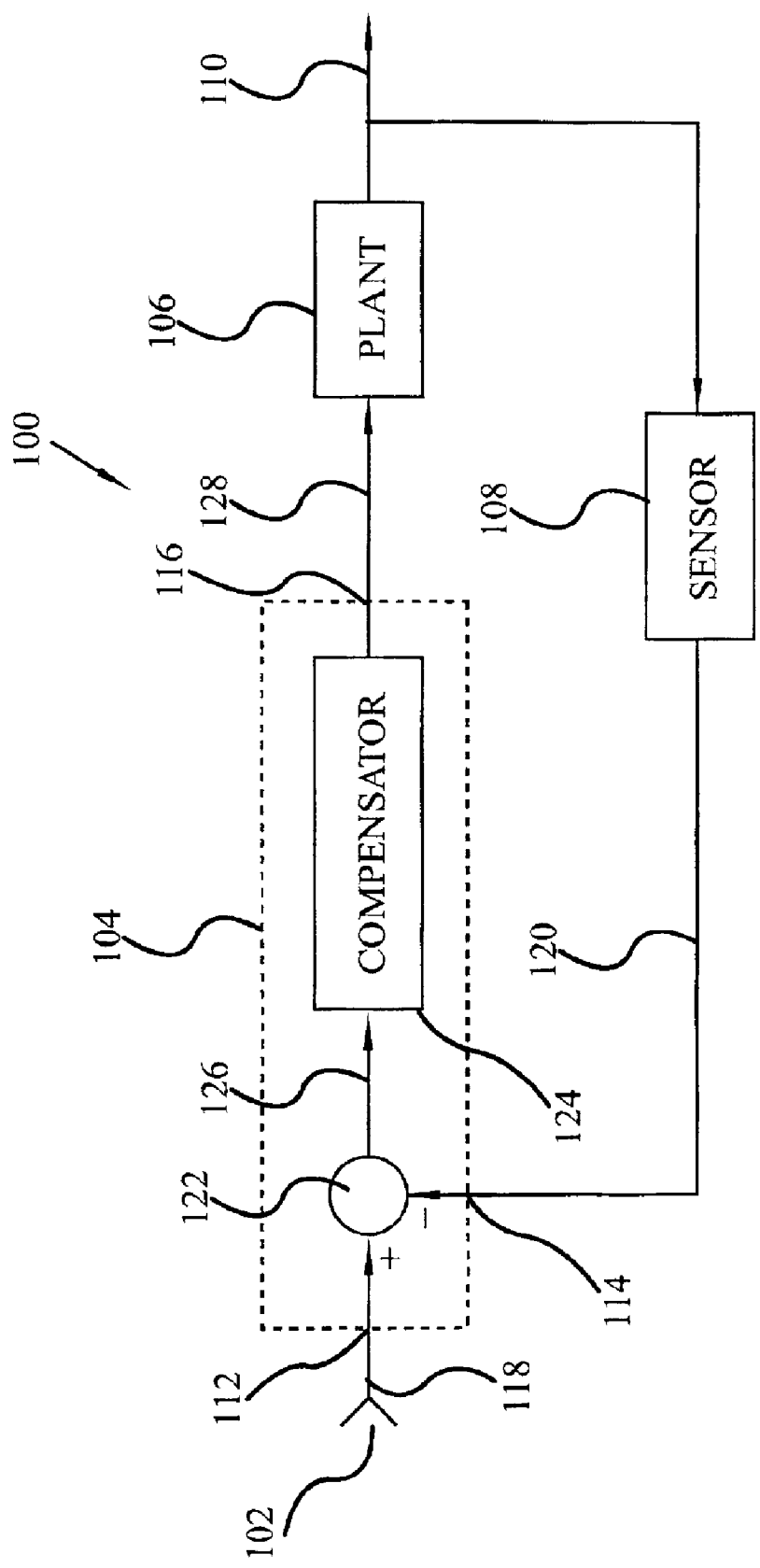
FIG. 1 depicts a simplified functional block diagram of a single loop closed-loop control system which may include the digital filter of the present invention.

A simplified functional block diagram of a single loop closed-loop control system which may include the digital filter of the present invention is depicted in FIG. 1. As FIG. 1 illustrates, the simple single loop closed-loop control system 100 includes a system input 102, a controller 104, a plant 106, a sensor 108, and a system output 110. The controller 104 includes a first input 112, a second input 114, and an output 116. The system input 102 is coupled to the first controller input 112 and supplies a reference signal 118 that is representative of the desired system output 110. The second controller input 114 receives a feedback signal 120 representative of the actual system output 110. The sensor 108 is coupled between the second controller input 114 and the actual system output 110 and provides the feedback signal 120. The controller 102 additionally includes a comparator 122 and a compensator 124. The comparator 122 compares the reference signal 118 and the feedback signal 120 and supplies an error signal 126 to the compensator 124. The compensator 124, which may also be referred to as a regulator or control filter, conditions and filters the error signal 126 and supplies, via its output 116, an appropriate control signal 128 to the plant 106.

The plant 106, as generally referred to herein, is that part of the system 100 that is being controlled, which may be a particular device or particular parameter. For instance, and by way of example only, the plant 106 may be the position of a machine tool, an aircraft control surface, or a magnetic bearing suspension. Or, the plant 106 may be the temperature of a particular environment, non-limiting examples of which include, an aircraft cabin or one or more spaces in a building, or the pressure of a particular environment, non-limiting examples of which include, an aircraft cabin or an industrial process chamber. In any case, the plant 106 receives the control signal 128 from the controller 104 and causes the system output 110 to change accordingly, until the error signal 126 is zero.

Figure 2:
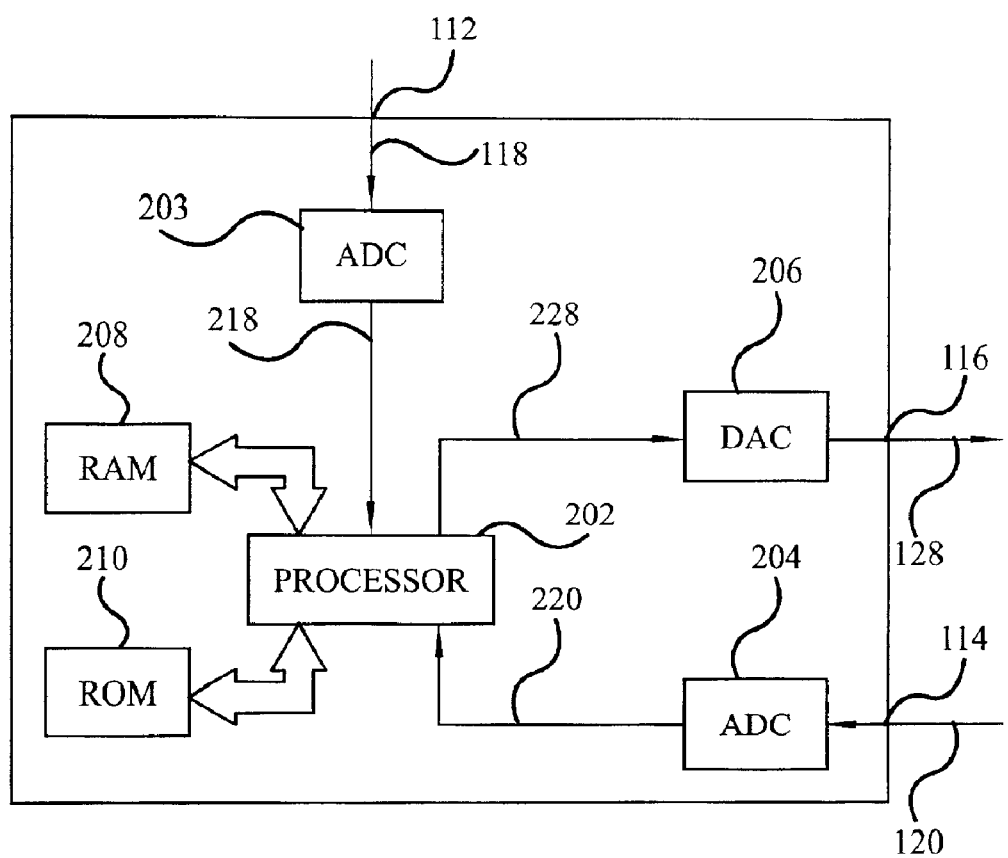
FIG. 2 depicts a simplified functional block diagram of a controller used in the closed-loop control system of FIG. 1.

A simplified functional block diagram of the controller 104 is depicted in FIG. 2. The controller 104 is implemented using a digital signal processor (DSP) based design. Thus, the controller 104 includes a main processor 202, first analog-to-digital converter (ADC) circuitry 203, second ADC circuitry 204, digital-to-analog converter (DAC) circuitry 206, random access memory (RAM) 208, and read-only-memory (ROM) 210. The main processor 202, which may be a specially designed processor or a general purpose microprocessor, receives a a digital reference signal 218 from the first ADC circuitry 203, and a digital feedback control signal 220 from the second ADC circuitry 204, and supplies a digital control signal 228 to the DAC circuitry 210. The first 203 and second 204 ADC circuitry receive the analog reference and feedback control signals 118, 120, respectively, from the controller input 112 and sensor 108, respectively, and convert each to the digital reference 218 and feedback control 220 signals, respectively, by sampling the respective analog signal at a predetermined sampling frequency. The DAC circuitry 206 receives the digital control signal 228 from the processor 202 and converts it to the analog control signal 128 that is supplied to the plant 106. It will be appreciated that the controller 104 could be configured to include only one ADC circuitry that would be shared, in multiplexed fashion, by the reference signal 118 and feedback signal 120.

The RAM 208 is used by the processor 202 to store various data, including the digital signal values sampled by the ADC circuitry 204, as well as data processed by the processor 202. As will be discussed further below, the data stored in the RAM 208 may include data from a present processing cycle or one or more previous processing cycles. The ROM 210 stores the software program that is used to control the overall operation of the processor 202. Thus, the software stored in the ROM 210 controls how the processor 202 manipulates the sampled and stored data to produce the control output signal and, as will now be discussed, may also include software for implementing a digital filter, or series of filters.

Figure 3:
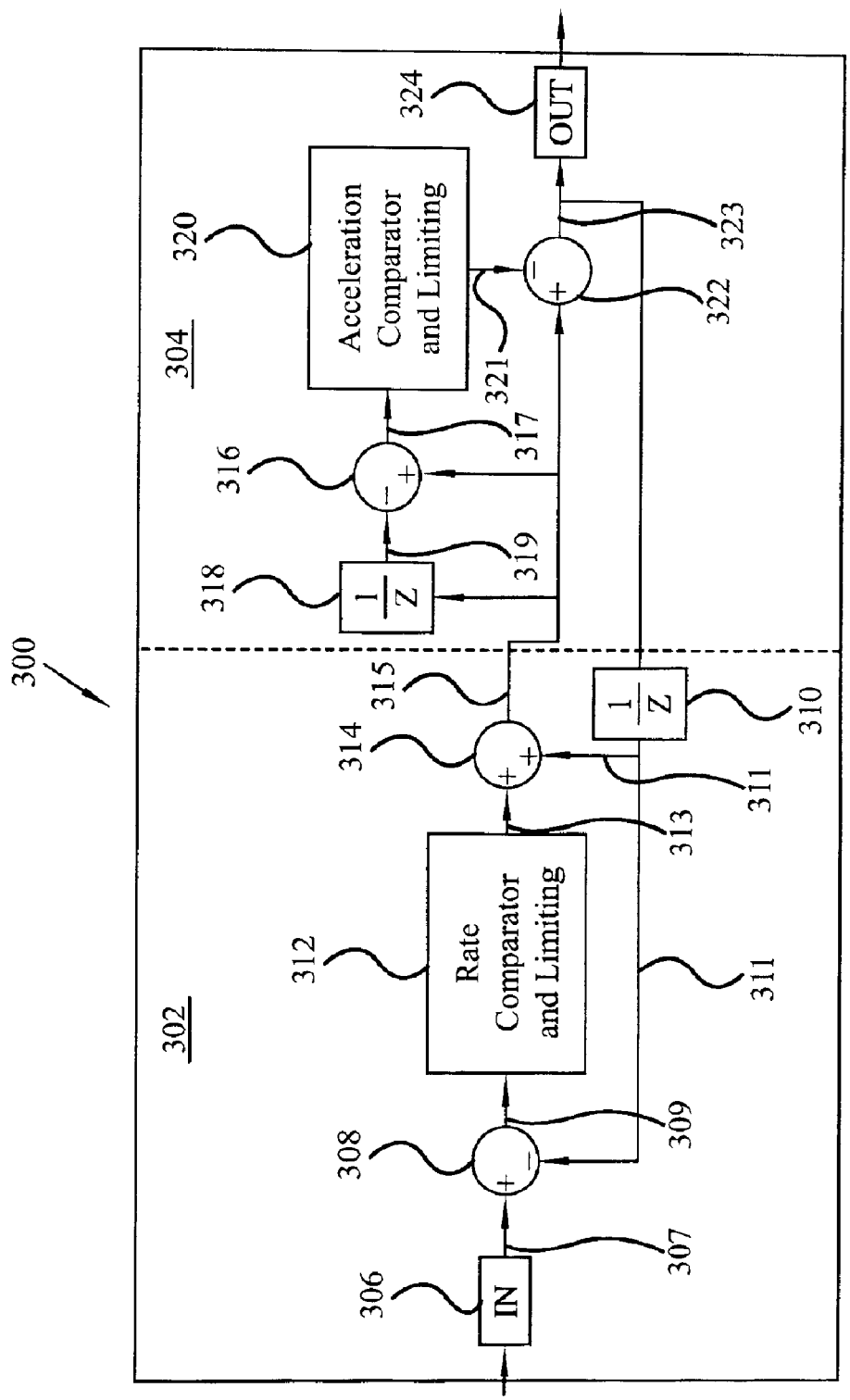
FIG. 3 depicts a functional software block diagram of the digital filter according to an embodiment of the present invention.

Having generally described a DSP based control system that may use the digital noise filter of the present invention, a detailed description of this digital filter will now be provided. In doing so, attention should first be turned to FIG. 3, which depicts a functional software block diagram of a particular preferred embodiment of a digital filter 300. It will be understood that the block diagram depicted in FIG. 3 generally does not represent physical component blocks, but functional blocks carried out by one or more portions of the software that is stored in a memory, such as, for example, the ROM 210 depicted in FIG. 2. The exception to this are the unit delays, or memory states, that are described below, which may represent physical memory states in a memory device, such as the RAM 208. It is additionally noted that the digital filter 300 is preferably implemented, and indeed may be placed in series with, a compensator. The compensator, as is generally known, is designed to provide desired system performance and closed-loop stability. Since a detailed description of the compensator is not necessary to understand the present invention, it will not be discussed further.

The filter 300 includes two stages, a first stage 302 and a second stage 304. The first stage 302 includes a filter input 306, a first difference portion 308, a first unit delay 310, a rate comparator and limiting portion 312, and a summing portion 314. The second stage 304 includes a second difference portion 316, a second unit delay 318, an acceleration comparator and limiting portion 320, a third difference portion 322, and a filter output 324.

Turning first to the first stage 302, the filter input 306 receives a present digital input signal value 307, such as a sampled sensor signal 220, and supplies it to the first difference portion 308. The first unit delay 310, which is representative of a first memory state, stores a digital signal value 311 that is representative of the digital filter output 324 from the filter's previous processing cycle. As was alluded to above, the first unit delay 310 may be implemented using a memory state in the RAM 208. The first difference portion 308 receives the present digital input signal value 307 from the filter input 306 and the previous digital output signal value 311 from the first unit delay 310, and determines the difference between these two values.

The first difference portion 308 supplies a digital signal value 309 that is representative of the magnitude difference between the present digital input signal value 307 and the previous digital output signal value 311 to the rate comparator and limiting portion 312. The rate comparator and limiting portion 312 compares the difference value 309 to a predetermined rate magnitude, and supplies an appropriate rate adjusted digital signal value 313. In particular, if the difference value 309 is less than the predetermined rate magnitude, then the rate adjusted digital signal value 313 is equivalent to the difference value 309. Conversely, if the difference value 309 meets or exceeds the predetermined rate magnitude, then rate adjusted digital signal value 313 is limited to a predetermined maximum value.

The rate adjusted digital signal value 313 and the previous digital output signal value 311 are each supplied to the first summer portion 314. The first summer portion 314 adds these digital signal values together to remove the previous digital output signal value 311 component from the rate adjusted digital signal value 313 and supplies a first stage digital output signal value 315 to the second stage 304. Thus, when the rate adjusted digital signal value 313 is equivalent to the difference value 309, the first stage digital output signal value 315 is equivalent to the present digital input signal value 307. Alternatively, when the rate adjusted digital signal value 313 is limited to the predetermined value, the first stage digital output signal value 315 is equivalent to a predetermined rate limit value, which is equivalent to the predetermined value plus the previous digital output signal value 311.

Turning now to the second stage 304, the first stage digital output signal value 315 is supplied to the second difference portion 316, to the second unit delay 318 for use in the next processing cycle, and to the third difference portion 322. The second unit delay 318, similar to the first unit delay 310, is representative of a second memory state and stores a digital signal value 319 that is representative of the first stage digital output signal value 315 from the filter's previous processing cycle. Again, similar to the first unit delay 310, the second unit delay 318 may be implemented using a memory state in the RAM 208. The previous first stage digital output signal value 319 is also supplied to the second difference portion 316, which determines the difference between these two values.

The second difference portion 316 supplies a digital signal value 317 that is representative of the magnitude difference between the present first stage digital output signal value 315 and the previous first stage digital output signal value 319 to the acceleration comparator and limiting portion 320. The acceleration comparator and limiting portion 320 compares the difference value 317 to a predetermined acceleration magnitude, and supplies an appropriate acceleration adjusting digital signal value 321. In particular, if the difference value 317 is less than the predetermined acceleration magnitude, then the acceleration adjusting digital signal value 321 is set to zero. Conversely, if the difference value 317 meets or exceeds the predetermined acceleration magnitude, then the acceleration adjustment digital signal value 321 is set to a non-zero, residual acceleration magnitude. The residual acceleration magnitude is equal to the magnitude difference between the difference value 317 (e.g., the actual acceleration) and the predetermined acceleration magnitude.

The acceleration adjustment digital signal value 321 and the previous first stage digital output signal value 315 are each supplied to the third difference portion 322. The third difference portion 322 takes the difference of these digital signal values and supplies a digital output signal value 323 to the filter output 324. The digital output signal value 323 is also supplied to the first unit delay 310 for use in the next processing cycle. Thus, when the acceleration adjustment digital signal value 321 is set to zero, the digital output signal value 323 is equivalent to the first stage digital output signal value 315. Alternatively, when the acceleration adjustment digital signal value 321 is set to the non-zero, residual acceleration magnitude, the digital output signal value 323 is an acceleration adjusted digital output signal value, which is equivalent to the first stage digital output signal value 313 minus the acceleration adjustment digital signal value 321.

Having described the digital filter 300 filter from a functional software block diagram point of view, a description of the overall process implemented by the digital filter 300 will now be provided. To facilitate this description, reference should now be made to FIG. 4, which illustrates the filtration process in flowchart form, in combination with FIG. 3. In this regard, it is noted that the parenthetical references to "BLOCKs" in the following discussion correspond to the particular reference numerals in the flowchart.

Figure 4:
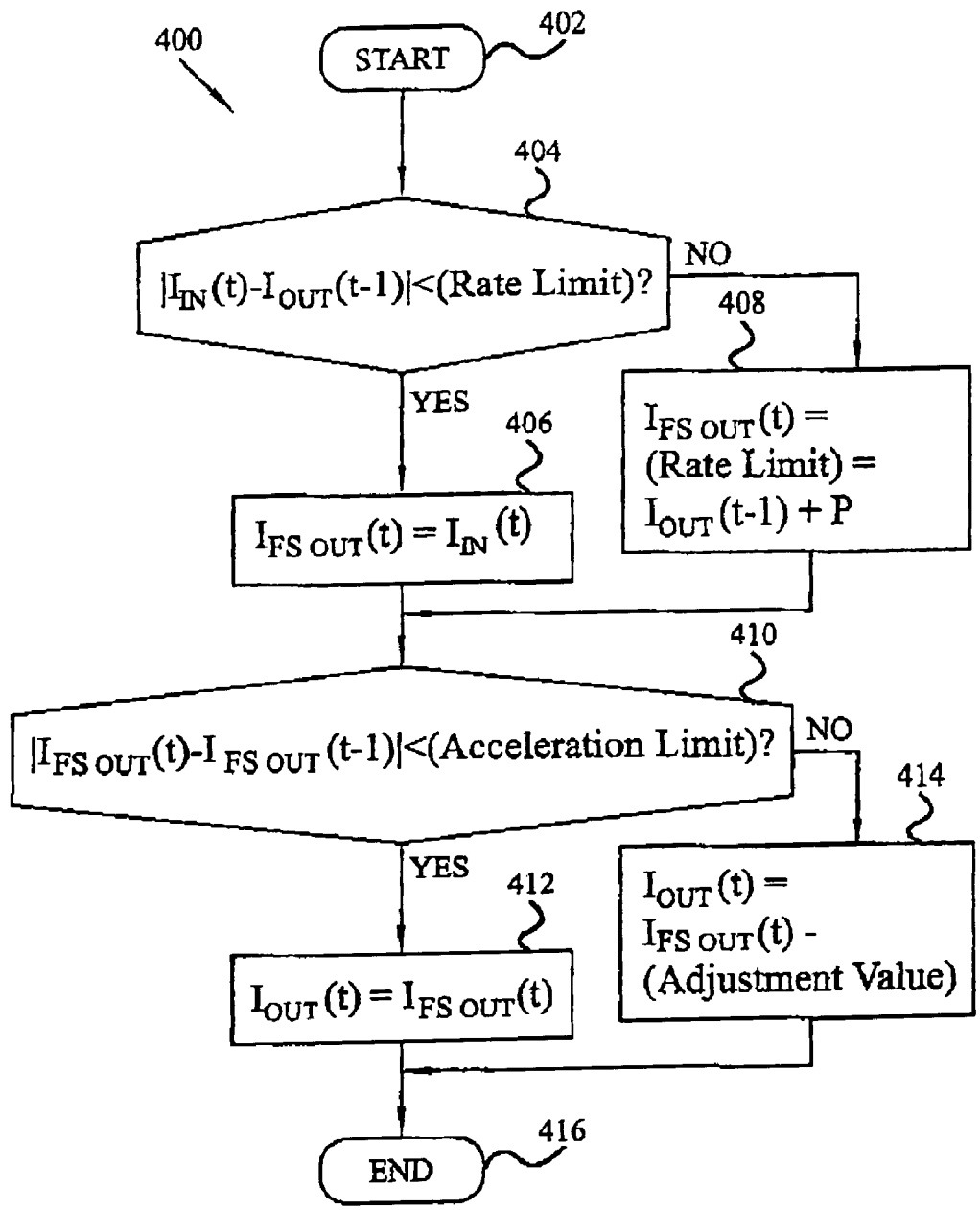
FIG. 4 FIG. 4 illustrates the filtration process in flowchart form that is carried out by the filter depicted in FIG. 3.

With the above background in mind, it is seen in FIG. 4 that the filtration process 400 initially determines whether the rate of change of the present digital input signal value 307 ($I_{in}(t)$) relative to the previous digital output signal value 311 ($I_{out}(t-1)$) is less than the predetermined rate magnitude (BLOCK 404). As was noted above, this determination is preferably implemented by calculating the difference between the present digital input signal value 307 ($I_{in}(t)$) and the previous digital output signal value 311($I_{out}(t-1)$), and comparing the difference to the predetermined rate magnitude. If the comparison indicates that the rate of change is less than the predetermined rate magnitude, then the present first stage digital output signal value 315 ($I_{FSout}(t)$) is set to the present digital input signal value (BLOCK 406). Conversely, if the comparison indicates that the first rate of change is not less than the predetermined rate magnitude, then the present first stage digital output value 315 ($I_{FSout}(t)$) is set to the predetermined rate limit value which, as noted above, is equal to the predetermined value (P) plus the previous digital output signal value 311 ($I_{out}(t-1)$) (BLOCK 408).

Thereafter, the process 400 determines whether a second rate of change or, in other words, an acceleration, is within the predetermined acceleration magnitude deadband (BLOCK 410). This second rate of change is that of the present first stage digital output signal value 315 ($I_{FSout}(t)$) relative to the previous first stage digital output signal value 319 ($I_{FSout}(t-1)$). As was also noted above, this determination is preferably implemented by calculating the magnitude difference between the present first stage digital output signal value 315 ($I_{FSout}(t)$) and the previous first stage digital output signal value 319 ($I_{FSout}(t-1)$), and comparing the magnitude difference to the predetermined acceleration magnitude. If this comparison indicates that this second rate of change is less than the predetermined acceleration magnitude, then the digital output signal value 323 ($I_{out}(t)$) supplied to the filter output 324 is set to the first stage digital output signal value 315 (BLOCK 412). Conversely, when this comparison indicates that this second rate of change is not less than the predetermined acceleration magnitude, the digital output signal value 323 ($I_{out}(t)$) supplied to the filter output 324 is an acceleration adjusted digital output signal value, which is set to the first stage digital output signal value 315 ($I_{FSout}(t)$) minus the residual acceleration magnitude (BLOCK 414).

With the digital filter 300 and the process 400 implemented by the filter 300, relatively slowly changing input signals are passed through the filter substantially unchanged, while relatively rapidly changing signals are attenuated. The threshold of what constitutes a rapidly changing signal is determined by the settings of the predetermined rate magnitude and the predetermined acceleration magnitude. It is to be appreciated that these values may be set to any one of numerous values, which will depend upon the system in which the filter 300 is implemented.

Figure 5:
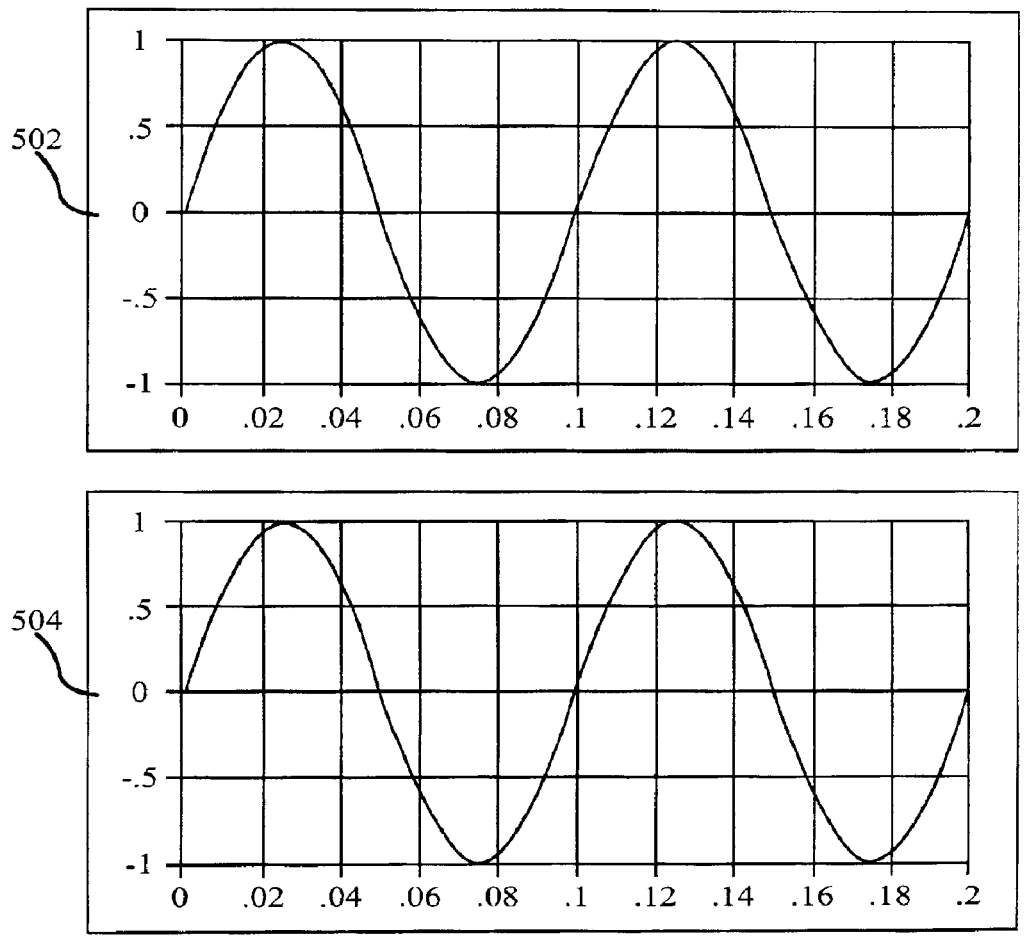
FIG. 5 illustrates the performance of an embodiment of the filter depicted in FIG. 1 by depicting exemplary filter input and output signals when the input signal includes no noise.
Figure 6:
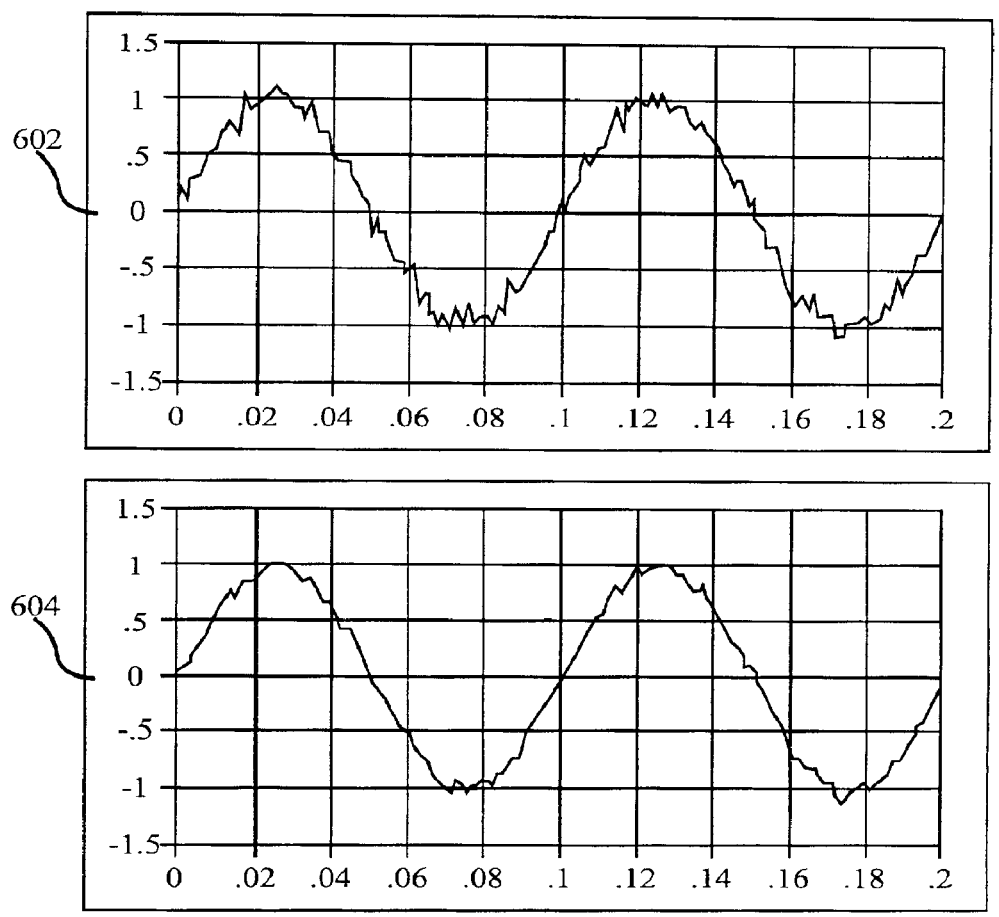
FIG. 6 illustrates the performance of an embodiment of the filter depicted in FIG. 3 by depicting exemplary filter input and output signals when the input signal includes relatively low power noise.
Figure 7:
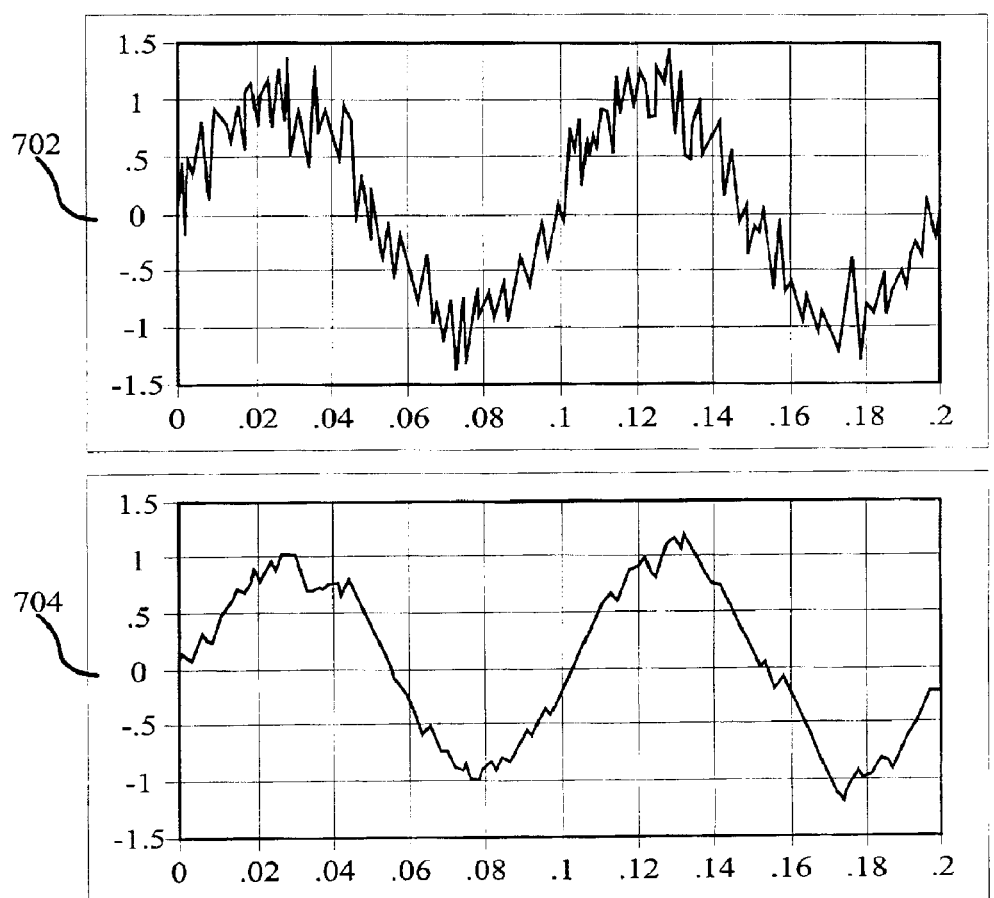
FIG. 7 illustrates the performance of an embodiment of the filter depicted in FIG. 3 by depicting filter input and output signals when the input includes relatively high power noise.

The performance of a particular embodiment of the filter 300 with the predetermined rate magnitude set to 0.1 volt/sample, and the predetermined acceleration magnitude set to 0.7 volt/sample$^2$ is depicted in FIGS. 5 through 7 for a sinusoidal input signal having various levels of white noise. In particular, FIG. 5 depicts filter input 502 and output 504 signals for a 1.0 volt (RMS), 10 Hz sinusoidal input signal having no noise, FIG. 6 depicts filter input 602 and output 604 signals for this same sinusoidal input having 0.1 volt (RMS), 1.0 kHz noise, and FIG. 7 depicts filter input 702 and output 704 signals for this same sinusoidal input having 0.5 volt (RMS), 1.0 kHz noise. As can bee seen from FIGS. 6 and 7, the filter 300 significantly attenuates high power noise from the input signal 602, 702, while supplying a filtered output signal 604, 704 that is reasonably equivalent to the original signal before noise was injected.

Figure 8:
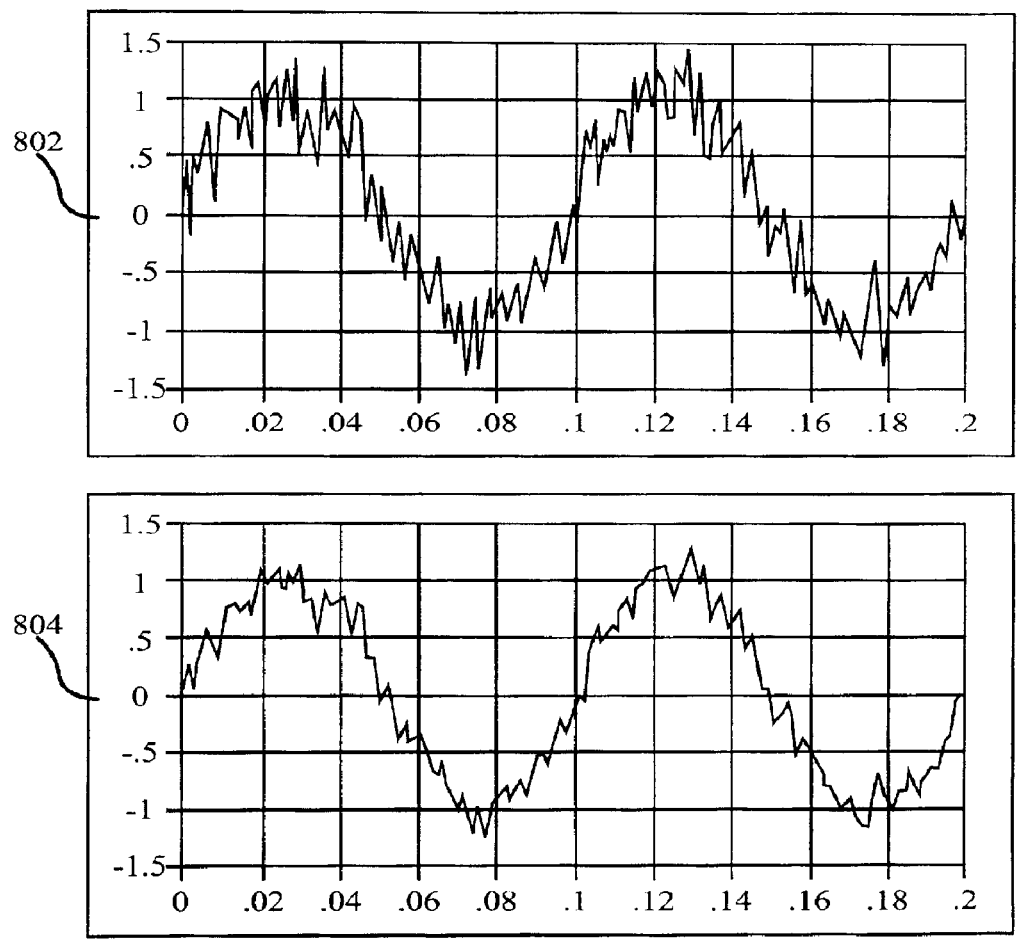
FIG. 8 illustrates the performance of a conventional filter by depicting filter input and output signals when the input includes relatively high power noise.

For comparison purposes, FIG. 8 depicts the performance of a conventional second-order noise filter that is set for a 100 Hz bandwidth and a 0.7 damping ratio. In particular, FIG. 8 depicts input 802 and output 804 signals for this conventional filter with a 1.0 volt (RMS), 10 Hz sinusoidal signal having 0.5 volt (RMS), 1.0 kHz noise applied to its input. As can be seen, the conventional filter does not provide the same level of attenuation as the digital filter of the present invention. Specifically, the conventional filter is approximately 30% as effective. Moreover, the conventional filter causes a phase lag of the input signal 802, whereas the digital filter of the present invention does not.

The digital filter 300 was depicted and described, for convenience, as being located in the compensator 124. However, it will be appreciated that the filter 300 is not limited to this particular implementation. Indeed, the filter 300 could also be located, for example, between the comparator 122 and the second controller input 114. With this implementation, the filter 300 would specifically filter any noise in the feedback signal 120 supplied from the sensor 108.

The digital filter and filtering method described above uses a rate of change limit and an acceleration limit to significantly attenuate high bandwidth noise signals with minimal phase lag, while simultaneously passing low bandwidth signals substantially uncorrupted. The filter uses only two memory states and, thus, is computationally efficient. Although the filter and filtering method may be used in varied control system applications, it is best suited for systems in which the noise bandwidth exceeds the control bandwidth, which is often the case for high sample rate systems with white noise injection.

While the invention has been described with reference to a preferred embodiment, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

I claim:

1. A method of filtering a digital input signal having a digital value associated therewith, the method comprising:
   determining a first rate of change of the digital input signal value relative to a previous digital output signal value;
   supplying a rate adjusted digital output signal value that is (i) equivalent to the digital input signal value when the first rate of change is less than a predetermined rate magnitude and (ii) equivalent to a predetermined rate limit value when the first rate of change equals or exceeds the predetermined rate magnitude;
   determining a second rate of change of the rate adjusted digital output signal value relative to a previous rate adjusted digital output signal value; and
   supplying an acceleration adjusted digital output signal value that is (i) equivalent to the rate adjusted digital output signal value when the second rate of change is less than a predetermined acceleration magnitude and (ii) equivalent to the rate adjusted digital output signal value with an acceleration adjustment value subtracted therefrom when the second rate of change equals or exceeds the predetermined acceleration magnitude.

2. The method of claim 1, wherein the step of determining the first rate of change comprises:
   comparing the digital input signal value to the previous digital output signal value.

3. The method of claim 2, wherein the step of comparing comprises:
   subtracting the previous digital output signal value from the digital input signal value to obtain a first difference value.

4. The method of claim 3, wherein the step of determining the first rate of change further comprises:
   comparing the first difference value to the predetermined rate magnitude.

5. The method of claim 1, wherein the step of determining the second rate of change comprises:
   comparing the rate adjusted digital output signal value to the previous rate adjusted digital output signal value.

6. The method of claim 5, wherein the step of comparing comprises:
   subtracting the previous rate adjusted digital output signal value from the rate adjusted digital output signal value to obtain a second difference value.

7. The method of claim 6, wherein the step of determining the second rate of change further comprises:
   comparing the second difference value to the predetermined acceleration magnitude.

8. The method of claim 6, wherein the acceleration adjustment value is set to a value that is equal to a magnitude difference between the second difference value and the predetermined acceleration magnitude.

9. A method of filtering a digital input signal having a digital value associated therewith, the method comprising:
   determining a first rate of change of the digital input signal value relative to a previous digital output signal value;
   supplying the digital input signal value as first stage digital output signal value when the first rate of change is less than a predetermined rate magnitude;

limiting the digital input signal value to a predetermined rate limit value and supplying the limited digital input signal value as the first stage digital output signal value when the first rate of change equals or exceeds the predetermined rate magnitude;

determining a second rate of change of the first stage digital output signal value relative to a previous first stage digital output signal value;

supplying the first stage digital output signal value as a digital output signal value when the second rate of change is less than a predetermined acceleration magnitude; and subtracting an acceleration adjustment value from the first stage digital output signal value to obtain an acceleration limited digital signal value and supplying the acceleration limited digital signal value as the digital output signal value when the second rate of change equals or exceeds the predetermined acceleration magnitude.

10. The method of claim 9, wherein the step of determining the first rate of change comprises:

comparing the digital input signal value to the previous digital output signal value.

11. The method of claim 10, wherein die step of comparing comprises:

subtracting the previous digital output signal value from the digital input signal value to obtain a first difference value.

12. The method of claim 11, wherein the step of determining the first rate of change further comprises:

comparing the first difference value to the predetermined rate magnitude.

13. The method of claim 9, wherein the step of determining the second rate of change comprises:

comparing the first stage digital output signal value to the previous first stage digital output signal value.

14. The method of claim 13, wherein the step of comparing comprises:

subtracting the previous first stage digital output signal value from the first stage digital output signal value to obtain a second difference value.

15. The method of claim 14, wherein the step of determining the second rate of change further comprises:

comparing the second difference value to the predetermined acceleration magnitude.

16. The method of claim 14, wherein the acceleration adjustment value is set to a value that is equal to a magnitude difference between the second difference value and the predetermined acceleration magnitude.

17. A method of filtering a digital input signal having a digital value associated therewith, the method comprising:

subtracting a previous digital output signal value from the digital input signal value to obtain a first rate of change of the digital input signal value relative to the previous digital output signal value;

comparing the first rate of change to a predetermined rate magnitude;

supplying a rate adjusted digital output signal value that is (i) equivalent to the digital input signal value when the first rate of change is less than the predetermined rate magnitude and (ii) equivalent to a predetermined rate limit value when the first rate of change equals or exceeds the predetermined rate magnitude;

subtracting a previous rate adjusted digital output signal value from the rate adjusted digital output signal value to obtain a second rate of change of the rate adjusted digital output signal value relative to the previous rate adjusted digital output signal value;

comparing the second rate of change to a predetermined acceleration magnitude; and supplying an acceleration adjusted digital output signal value that is (i) equivalent to the rate adjusted digital output signal value when the second rate of change is less than the predetermined acceleration magnitude and (ii) equivalent to the rate adjusted digital output signal value with an acceleration adjustment value subtracted therefrom when the second rate of change equals or exceeds the predetermined acceleration magnitude.

18. In a filter operable to receive a present digital input signal having a digital value associated therewith and to supply a filtered digital output signal having a digital value associated therewith, a method of filtering the present digital input signal, the method comprising:

receiving the present digital input signal value;

determining a first magnitude difference between the present digital input signal value and a previous filtered digital output signal value;

comparing the first magnitude difference to a predetermined rate magnitude;

supplying the present digital input signal value as a present first stage digital output signal value when the first magnitude difference is less than the predetermined rate magnitude;

limiting the present digital input signal value to a predetermined rate limit value and supplying the limited digital input signal value as the present first stage digital output signal value when the first magnitude difference equals or exceeds the predetermined rate magnitude;

determining a second magnitude difference between the present first stage digital output signal value and a previous first stage digital output signal value;

comparing the second magnitude difference to a predetermined acceleration magnitude;

supplying the present first stage digital output signal value as the filtered digital output signal value when the second magnitude difference is less than the predetermined acceleration magnitude; and subtracting a residual acceleration value from the present first stage digital output signal value to obtain a present acceleration limited digital signal value and supplying the present acceleration limited digital signal value as the filtered digital output signal value when the second magnitude difference equals or exceeds the predetermined acceleration magnitude.

19. A digital filter for filtering a digital input signal having a digital value associated therewith, comprising:

rate of change determining means for (i) determining a first rate of change of the digital input signal value relative to a previous digital output signal value and (ii) supplying a rate adjusted digital output signal value that is (a) equivalent to the digital input signal value when the first rate of change is less than a predetermined rate magnitude, and (b) equivalent to a predetermined rate limit value when the first rate of change equals or exceeds the predetermined rate magnitude;

and acceleration determining means for (i) determining a second rate of change of the rate adjusted digital output signal value relative to a previous rate adjusted digital output signal value and (ii) supplying an acceleration adjusted digital output signal value that is
- (a) equivalent to the rate adjusted digital output signal value when the second rate of change is less than a predetermined acceleration magnitude, and
- (b) equivalent to the rate adjusted digital output signal value with a residual acceleration value subtracted therefrom when the second rate of change equals or exceeds the predetermined acceleration magnitude.

20. The filter of claim 19, wherein the rate of change determining means comprises:
   first comparison means for comparing the digital input signal value to the previous digital output signal value.

21. The filter of claim 20, wherein the first comparison means comprises:
   first subtraction means for subtracting the previous digital output signal value from the digital input signal value to obtain a first difference value.

22. The filter of claim 21, wherein the rate of change determining means further comprises:
   second comparison means for comparing the first difference value to the predetermined rate magnitude.

23. The filter of claim 19, wherein the acceleration determining means comprises:
   third comparison means for comparing the rate adjusted digital output signal value to the previous rate adjusted digital output signal value.

24. The filter of claim 23, wherein the third comparison means comprises:
   second subtraction means for subtracting the previous rate adjusted digital output signal value from the rate adjusted digital output signal value to obtain a second difference value.

25. The filter of claim 24, wherein the acceleration determining means further comprises:
   fourth comparison means for comparing the second difference value to the predetermined acceleration magnitude.

26. The filter of claim 24, wherein the acceleration determining means further comprises:
   third subtraction means for subtracting the second difference value from the predetermined acceleration magnitude to obtain the residual acceleration value.

27. A digital filter for filtering a digital input signal having a digital value associated therewith, comprising:
   first subtraction means for subtracting a previous digital output signal value from the digital input signal value to obtain a first rate of change of the digital input signal value relative to the previous digital output signal value;
   first comparison means for (i) comparing the first rate of change value to a predetermined rate magnitude and (ii) supplying a rate adjusted digital output signal value that is
   - (a) equivalent to the digital input signal value when the first rate of change is less than the predetermined rate magnitude, and
   - (b) equivalent to a predetermined rate limit value when the first rate of change equals or exceeds the predetermined rate magnitude;
   second subtraction means for subtracting a previous rare adjusted digital output signal value from the rate adjusted digital output signal value to obtain a second rate of change of the rate adjusted digital output signal value relative to the previous rate adjusted digital output signal value;
   second comparison means for (i) comparing the second rate of change to a predetermined acceleration magnitude and (ii) supplying an acceleration adjusted digital output signal value that is
   - (a) equivalent to the rate adjusted digital output signal value when the second rate of change is less than the predetermined acceleration magnitude, and
   - (b) equivalent to the rate adjusted digital output signal value with a residual acceleration value subtracted therefrom when the second rate of change equals or exceeds the predetermined acceleration magnitude.

28. A computer readable storage medium containing computer executable code for instructing a processor to filter a digital input signal having a digital value associated therewith by performing the steps of:
   determining a first rate of change of the digital input signal value relative to a previous digital output signal value;
   supplying a rate adjusted digital output signal value that is (i) equivalent to the digital input signal value when the first rate of change is less than a predetermined rate magnitude and (ii) equivalent to a predetermined rate limit value when the first rate of change equals or exceeds the predetermined rate magnitude;
   determining a second rate of change of the rate adjusted digital output signal value relative to a previous rate adjusted digital output signal value; and
   supplying an acceleration adjusted digital output signal value that is (i) equivalent to the rate adjusted digital output signal value when the second rate of change is less than a predetermined acceleration magnitude and (ii) equivalent to the rate adjusted digital output signal value with an acceleration adjustment value subtracted therefrom when the second rate of change equals or exceeds the predetermined acceleration magnitude.

* * * * *

UNITED STATES PATENT AND TRADEMARK OFFICE
CERTIFICATE OF CORRECTION

| | | |
|---|---|---|
| PATENT NO. | : 6,937,678 B2 | Page 1 of 1 |
| APPLICATION NO. | : 09/975865 | |
| DATED | : August 30, 2005 | |
| INVENTOR(S) | : Stephen G. Abel | |

It is certified that error appears in the above-identified patent and that said Letters Patent is hereby corrected as shown below:

In Column 9, line 24, claim 11 delete "die" and add --the--

Signed and Sealed this

Second Day of October, 2007

JON W. DUDAS
*Director of the United States Patent and Trademark Office*